(12) United States Patent
Brofman et al.

(10) Patent No.: US 6,278,184 B1
(45) Date of Patent: Aug. 21, 2001

(54) SOLDER DISC CONNECTION

(75) Inventors: Peter J. Brofman, Hopewell Junction; Patrick A. Coico, Fishkill; Mark G. Courtney, Poughkeepsie; Lewis S. Goldmann, Bedford; Raymond A. Jackson, Fishkill; William E. Sablinski, Beacon; Kathleen A. Stalter, Hopewell Junction; Hilton T. Toy, Wappingers Falls; Li Wang, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/400,783

(22) Filed: Sep. 22, 1999

Related U.S. Application Data

(62) Division of application No. 08/890,458, filed on Jul. 9, 1997, now Pat. No. 6,070,321.

(51) Int. Cl.⁷ ............................. H01L 23/48; H01L 23/52
(52) U.S. Cl. ..................... 257/737; 257/738; 257/779; 257/782; 257/772; 228/180.22; 228/246; 228/56.3
(58) Field of Search ............................. 228/180.22, 245, 228/56.3, 193, 246; 257/737, 738, 779, 782, 784, 772

(56) References Cited

U.S. PATENT DOCUMENTS

| 3,089,062 | 5/1963 | Schulz . |
|---|---|---|
| 3,331,912 | 7/1967 | Stricker et al. . |
| 3,392,442 | 7/1968 | Napier et al. . |
| 4,020,987 | 5/1977 | Hascoe . |
| 4,640,438 | 2/1987 | Trevison et al. . |
| 4,746,583 | 5/1988 | Falanga . |
| 5,153,709 | 10/1992 | Fukuoka . |
| 5,268,815 | 12/1993 | Cipolla et al. . |
| 5,294,830 | 3/1994 | Young et al. . |
| 5,324,892 | 6/1994 | Granier et al. . |
| 5,329,160 | 7/1994 | Miura et al. . |
| 5,372,295 | 12/1994 | Abe et al. . |
| 5,414,300 | 5/1995 | Tozawa et al. . |
| 5,471,027 | 11/1995 | Call et al. . |
| 5,517,753 | 5/1996 | Messina . |
| 5,523,260 | 6/1996 | Missele . |
| 5,551,627 * | 9/1996 | Leicht et al. .................. 228/180.22 |
| 5,881,945 | 3/1999 | Edwards et al. . |

OTHER PUBLICATIONS

IBM Technical Bulletin, vol. 29, No. 4, Sep. 1986.
IBM Technical Bulletin, vol. 26, No. 9, Feb. 1984.

* cited by examiner

Primary Examiner—Minh Loan Tran
(74) Attorney, Agent, or Firm—DeLio & Peterson, LLC; John J. Tomaszewski; Margaret A. Pepper

(57) ABSTRACT

A solder preform is provided for forming interconnections between multilayer ceramic substrates comprising an upper layer and lower layer of solder separated by an intermediate layer of a material which is wettable by solder and which does not melt at the temperatures used to reflow the solder and form the connections. The solder preform is used to join the substrates and is particularly useful to simultaneously electrically interconnect the substrates and to form a hermetic seal between the substrates being joined.

14 Claims, 4 Drawing Sheets

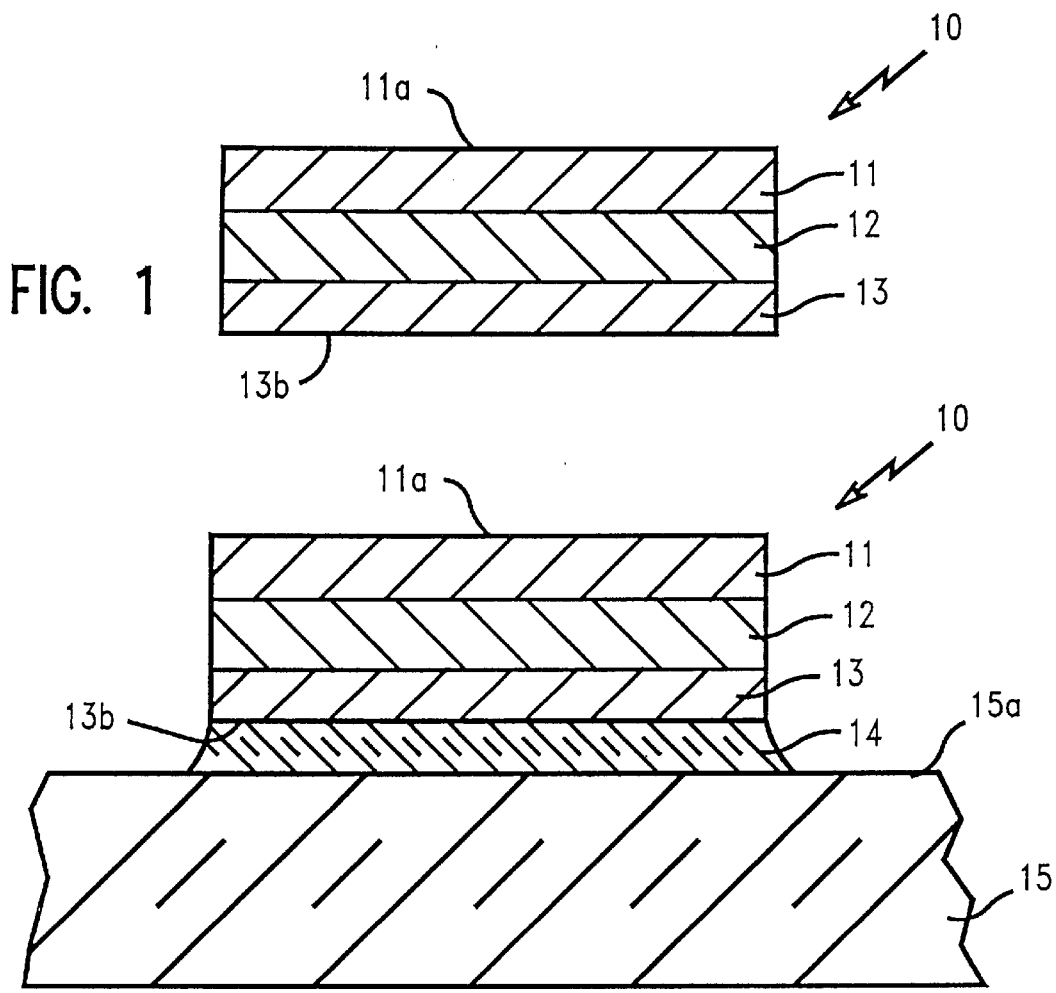
FIG. 1
FIG. 2A
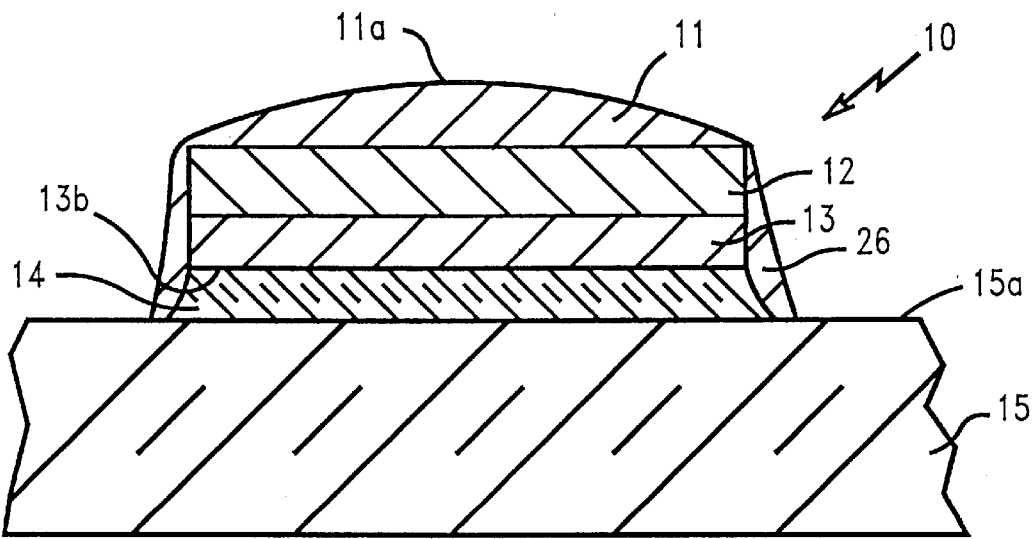
FIG. 2B

SOLDER DISC CONNECTION

This is a divisional of application(s) Ser. No. 08/890,458 filed on Jul. 9, 1997, now U.S. Pat. No. 6,070,321.

BACKGROUND OF THE INVENTION

1. Field of the Invention

This invention relates generally to electrically and mechanically connecting one electronic component to another electronic component to form an electronic assembly and, in particular, to using a specially defined solder disc connector to simultaneously hermetically seal the electronic assembly while electrically and mechanically connecting the electronic components of the assembly.

2. Description of Related Art

Forming an electronic package assembly whereby an electrical component such as an integrated circuit chip is electrically connected to a substrate such as a card, or board, another chip or any other electronic part is well-known in the art. Surface mount technology (SMT) has gained acceptance as the preferred means of joining electronic devices together, particularly in high end computers. While the invention is directed to forming such electronic package assemblies, the following description for convenience will be directed to joining ceramic electronic components such as multilayer ceramic components as exemplified by integrated circuit chips.

Multilayer ceramic electronic components are typically joined together by soldering pads on a surface of one of the electronic components to corresponding pads on the surface of the other component. Control Collapse Chip Connection is an interconnect technology developed by IBM as an alternative to wire bonding. This technology is generally known as C4 technology or flip chip packaging. Broadly stated, one or more integrated circuit chips are mounted above a single or multilayer ceramic substrate and pads on the chip are electrically and mechanically connected to corresponding pads on the substrate by a plurality of electrical connections such as solder bumps. The integrated circuit chips may be assembled in an array such as a 10×10 array on the multilayer ceramic surface.

In the C4 interconnect technology, a relatively small solder bump is attached to the pads on one of the components being joined. The electrical and mechanical interconnects are then formed by positioning the other electronic component adjacent the solder bumps and reflowing the bumps at an elevated temperature. The C4 joining process is self-aligning in that the wetting action of the solder will align the chip bump pattern to the corresponding substrate pads.

In the finished flip chip package, there is an opening or space between the pad containing surface of the integrated circuit chip and the pad containing surface of the joined substrate resulting from the thickness of the solder bump connection between the pads. This open space cannot be tolerated because any interference with the solder connections will adversely affect the performance of the package. For example, moisture, infusion of thermal paste used to increase heat transfer from the chip and mechanical integrity of the chip possibly breaking the electrical connections are all serious problems. To solve the problems, the joined integrated circuit chips are often encapsulated in a suitable plastic package to protect the integrated circuit chips and assembly mechanically, electrically and chemically.

In the C4 technology, the chip opening is encapsulated totally or, in many cases, a sealant is used around the chip edges to seal the opening. Presently, non-reworkable sealants which are thermoset highly cross-linked materials are used. Encapsulation of the packages, however, presents many problems. The package must be reliable and thermal mismatches between the encapsulant and the chip, substrate or solder bumps must be minimized to avoid stressing and damaging of the package. The encapsulant must be able to withstand the solder joining process temperatures. Further, the C4 encapsulated chip should also be reworkable to facilitate its usefulness.

A myriad of solder structures have been proposed for the surface mounting of one electronic structure to another. Typical surface mount processes form the solder structures by screening solder paste on conductive, generally metallic pads exposed on the surface of the first electronic structure or substrate. A stencil printing operation is used to align the contact mask to the pads. The solder paste areas on the screen substrate are then aligned to corresponding pads on the electronic structure or board to be connected. After alignment, the substrate and board go through a reflow operation to melt the solder paste and create a solder bond between the corresponding pads on the substrate and other electronic components.

Other known surface mount technology uses solder balls rather than solder paste to provide the solder connecting structures. By using solder balls, a more exact and somewhat greater quantity of solder can be applied than from screening. The solder balls are aligned and are held to a substrate and melted to form a solder joint on a conductive pad of the substrate. As before, the substrate with the newly joined solder balls is aligned to the board to be connected therewith and the solder balls are then reflowed to perform a solder bond between the two substrates.

In IBM Technical Disclosure Bulletin, Vol. 29, No. 4, September, 1986, the use of a copper ball surrounded by eutectic solder is shown as the joint structure for attaching a multilayer ceramic (MLC) substrate to a PC laminate wherein the ball serves as a standoff. A similar concept is described by Totta and Sopher for SLT technology as described in "SLT Device Metallurgy And Its Monolithic Extensions" IBM JRD, Vol. 13, No. 3, pps. 226–238, May, 1969. Both techniques employ soldering together of two distinct components. Japanese Pat. No. 7,099,385 describes the manufacturing process of preventing crushing of an entire solder ball due to melting of solder and provides a simple connection structure in the gap between connection terminal by using a metallic sphere precoated with solder. The basic SBC structure and processes are described in U.S. Pat. Nos. 5,060,844 and 5,118,027 which patents are hereby incorporated by reference. Also, in IBM Technical Disclosure Bulletin, Vol. 26, No. 9, February, 1984, a dimensionally controlled semiconductor package is shown whereby a lead-tin alloy preform is fabricated to facilitate hermetic sealing of a protective cap to a chip containing substrate. In the four corners of the preform are located copper disks whereby when the assembly is heated, the preform including the copper disks are attached to the substrate. The resulting attached preform is then subjected to a flattening operation and the cap placed in position. The assembly is then reflowed in an inert atmosphere to join the cap to the substrate.

Bearing in mind the problems and deficiencies of the prior art, it is therefore an object of the present invention to provide a solder connector which may be used to join electronic components.

It is a further object of the present invention to provide a solder connector which may be used to join multilayer ceramic components together and, more particularly, to simultaneously join the electronic components while providing a hermetic seal for the combined components and resulting assembly.

It is another object of the present invention to provide a method for making an electronic assembly by using a specially designed solder connector to join the electronic components making up the assembly.

It is an additional object of the present invention to provide a method for simultaneously joining two electronic components while simultaneously hermetically sealing the formed electronic assembly.

It is yet another object of the present invention to provide an electronic component assembly made using the method of the invention and the solder connector of the invention.

Other objects and advantages of the present invention will be readily apparent from the following description.

SUMMARY OF THE INVENTION

The above and other objects, which will be apparent to those skilled in the art, are achieved in the present invention which is directed in a first aspect to a method for fabricating an electronic assembly comprising at least two electronic components which are electrically and mechanically joined together comprising the steps:

providing a plurality of solder preforms, the solder preforms comprising:
a first lower layer of solder;
a second intermediate layer of a material which preferably does not melt at the temperatures used to form the joint between the two electronic components; and
a third upper layer of solder;

positioning the lower surface of the solder preforms on bonding pads of a first electronic component substrate and heating the substrate to melt the solder bonding the lower surface of the solder preform to the substrate pads, the upper solder surface of the preform melting but still maintaining an upper layer of solder on the preform after heating;

positioning a second electronic component proximate the first electronic component so that the solder preforms on the first electronic component are adjacent to corresponding bonding pads on the second electronic component;

heating the components to reflow the solder to bond the solder preforms on the first electronic component to the corresponding pads on the second electronic component and forming the electronic assembly.

In another aspect of the present invention, a method is provided for simultaneously fabricating an electronic assembly and hermetically sealing the assembly which comprises at least two electronic components which are electrically and mechanically joined together, the method comprising the steps:

providing a plurality of solder preforms, the solder preforms comprising:
a first layer of solder;
a second intermediate layer of a material which preferably does not melt at the temperatures used to form the joints between the two electronic components; and
a third upper layer of solder;

positioning the lower layer of the solder preforms on bonding pads of a first electronic component substrate and the lower layer of a peripheral solder preform positioned around the periphery of the first electronic component substrate;

heating the substrate to melt the solder bonding the lower surface of the solder preforms to the pads on the substrate and the peripheral solder preform around the periphery of the substrate, the upper solder surface of the preform melting and still maintaining an upper layer of solder on the preform after heating;

positioning a second electronic component proximate the first electronic component so that the solder preforms on the first electronic component are adjacent to corresponding bonding pads on the second electronic component and a peripheral bonding area on the second electronic component which surrounds the pads on the first electronic component and corresponds to the peripheral solder preform bonded to the first electronic component;

heating the component to reflow the solder to bond the solder preforms on the first electronic component to the corresponding pads on the second electronic component and the peripheral bonding area of the second component to the peripheral solder preform bonded to the first component substrate and simultaneously forming the electronic assembly and hermetically sealing the electronic assembly.

In a further aspect of the invention, a solder preform for use for joining two electronic components comprising:
a first lower layer of solder;
a second intermediate layer of a material which preferably does not melt at the temperatures used to form the joint between the two electronic components; and
a third upper layer of solder.

In an additional aspect of the present invention, an electronic component assembly is made using the method and solder preform as described hereinabove.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 shows a cross-sectional view solder preform disc connector of the present invention.

FIGS. 2A–2C show a process of the present invention for forming an electrical and mechanical interconnect between multilayer ceramic substrates shown in cross-section using the solder preform connector of FIG. 1.

DESCRIPTION OF THE PREFERRED EMBODIMENT

Figure 2C:
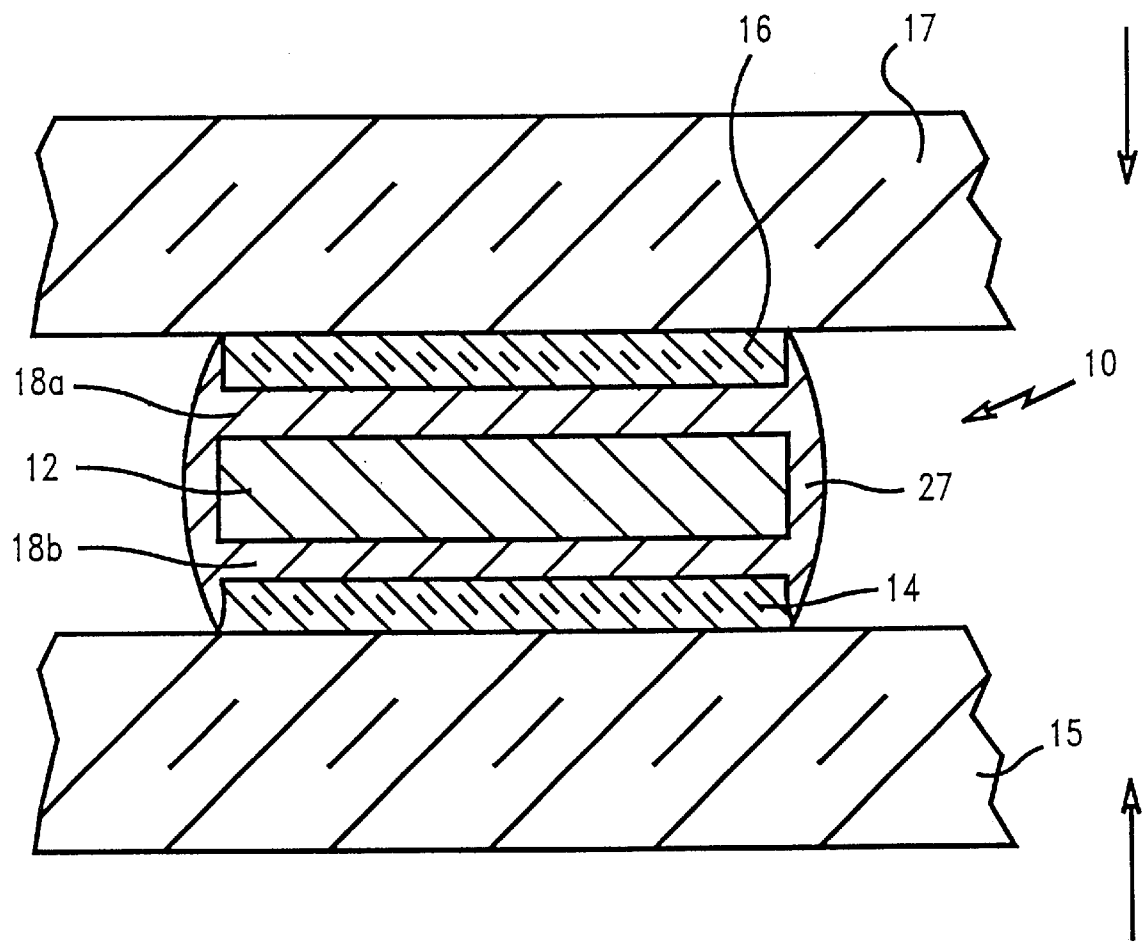

In describing the preferred embodiment of the present invention, reference will be made herein to FIGS. 1–5B of the drawings in which like numerals refer to like features of the invention. Features of the invention are not necessarily shown to scale in the drawings.

The solder preforms of the present invention can be used for connecting one component (substrate) to another component(substrate). In the packaging area, there are a myriad of electronic structures which require connection to other similar electronic structures or to other levels of packaging. For example, a card on which several integrated chips have been surface mounted may be subsequently surface mounted to a board which provides an interconnection circuit to a mainframe computer. Also, an integrated circuit chip might be mounted to a metallized multilayer ceramic substrate. For the sake of clarity and consistency, the solder preform connector of the present invention will be described as used to interconnect multilayer ceramic substrates to form an assembly which may be then used with other electronic components such as a circuit board.

Referring to FIG. 1, a solder disc preform connector of the present invention is shown. The connector is shown generally as 10 and comprises an upper layer of solder 11, an intermediate layer 12 of a solid non-melting solder wettable and preferably compliant material such as copper or higher melting point lead-tin solder, and a lower layer 13 of solder. The solder disc preform connector 10 is shown having a upper solder surface 11a which would be contacted with and bonded to a pad or other metallization on a first electronic component substrate and a lower surface 13b which likewise would be contacted with and bonded with the metallization on a corresponding pad of a second electronic component to be connected to form the assembly.

The solder preform connectors may be fabricated by any suitable means such as cladding solder sheets to a core sheet of either copper or other metal or higher melting point solder or other such suitable material. The sheet may be then punched out or otherwise formed into any desired shape, typically and preferably discs, or into hermetic seal preforms which are configured to be placed around the periphery of the components to be joined for hermetic sealing. The dimensions of the preform will vary widely depending on the use. Similarly, the thickness of the preform 10 as well as the individual layer thicknesses can be tailored to particular applications.

In general, the thickness of the intermediate layer 12 substantially controls the interconnection height and seal height. The thickness of the solder layers 11 and 13 substantially control the solder fillet geometry for both the hermetic solder seal and the electronic component connection. A typical solder preform disc connector and peripheral solder preform disc connection may have a 50 to 500 micrometer, e.g., 250 micrometer thick intermediate layer 12 and 25 to 150 micrometer, e.g., 75 micrometer each thick top layer 12 and bottom layer 13. As shown hereinbelow, either the upper solder layer 11 or lower solder layer 13 may be thicker or thinner for certain bonding applications.

It is an important feature of the invention that the solder preform disc connector may be employed to join multilayer ceramic substrates which typically have a substrate camber that even though excessive, will still allow simultaneous joining/sealing without the need for planarizing the two interfaces. In many assembly operations, the surfaces of the multilayer ceramic substrates must be planarized to form substantially parallel faces on the same plane to provide a hermetic seal and/or suitable solder interconnections. Using the solder preform connectors of the present invention, the thickness of either the top solder layer 11 or bottom solder layer 12 can be increased or decreased to allow for more accommodation of Z-axis differences upon assembly. Also, the core layer 12 may be chosen specifically for high compliance, i.e., the use of a high melting point solder rather than copper.

When making ceramic-to-ceramic solder connections between pads on each of the ceramic substrates and/or to simultaneously form a hermetic seal between the substrates, a compressive load is ordinarily applied to the sealing interfaces and the ceramic substrates which tends to squash/bridge ordinary solder connections. Typically, using conventional C-4 technology, connections formed before sealing would tend to prohibit proper sitting of the hermetic seal in the plane of thickness. Using the solder preform connectors and method of the present invention, a robust process for simultaneously soldering both the seal and the interconnections is provided. As further discussed hereinbelow, it is an important feature of the invention that solder flux can be avoided in the assembly by the use of nonflux required metallization pads on the electronic component to be joined to the electronic component on which the solder preforms have already been bonded thereon.

Referring to FIGS. 2A, 2B and 2C, a method is shown for interconnecting two multilayer ceramic substrates using the solder preform connectors of the present invention. In FIG. 2A, the solder preform connector 10 is shown positioned on pad 14 of multilayer ceramic substrate 15. Flux is not shown for purposes of clarity but would typically be on the surface of metallization pad 14 to secure solder preform 10 for the reflow (bonding) operation. The solder preform 10 is shown having an upper solder layer 11, an intermediate solid core nonmelting material 12 and a lower solder layer 13. The lower surface 13b of layer 13 is shown contacting the upper surface of metallization pad 14. The upper surface 11a of solder layer 11 will eventually contact and connect the metallization pad of the electronic component to be connected to multilayer ceramic substrate 15.

In FIG. 2B, the assembly of FIG. 2A has been heated (reflowed) to bond solder preform 10 to metallization pad 14. Reflow is a well known process whereby the assembly is heated to a temperature which melts the solder with the solder then joining (bonding) to a pad which contacts the solder preform. As a result of the reflow procedure, the upper layer 11 of solder also melts with part of the solder dripping over the sides of the preform 26 typically forming a rounded upper surface 11a. For some situations, a silica or other plate may be used during reflow so that the upper surface 11a of solder layer 11 is substantially flat.

The reflowed multilayer ceramic substrate of FIG. 2B is shown being connected to another multilayer ceramic substrate in FIG. 2C. Thus, a second multilayer ceramic substrate 17 having a metallization pad 16 would be placed adjacent and proximate to the upper surface 11a of solder layer 11 (and shown in FIG. 2B)and the assembly reflowed. The reflow is normally done under compression as shown by the arrows indicating a load placed on the assembly. After reflow, the multilayer ceramic substrate 15 is bonded electrically and mechanically to multilayer ceramic substrate 17 at their respective metallization pads 14 and 16 by reflowed solder 27. The solder layers of the preform 11 and 13 are shown forming a single solder joint which is basically a combination of the solder layers 11 and 13. Typically, solder layers 11 and 13 will be of the same solder composition and form the same composition after reflow. The intermediate core layer 12 is shown substantially intact in the interconnection between substrates 15 and 17. A thin layer of solder shown as 18a and 18b is shown joining the pads. During the reflow, the intermediate layer 12 does not melt and as noted hereinabove, substantially forms the height of the interconnection between the substrates 15 and 17.

Figure 3:
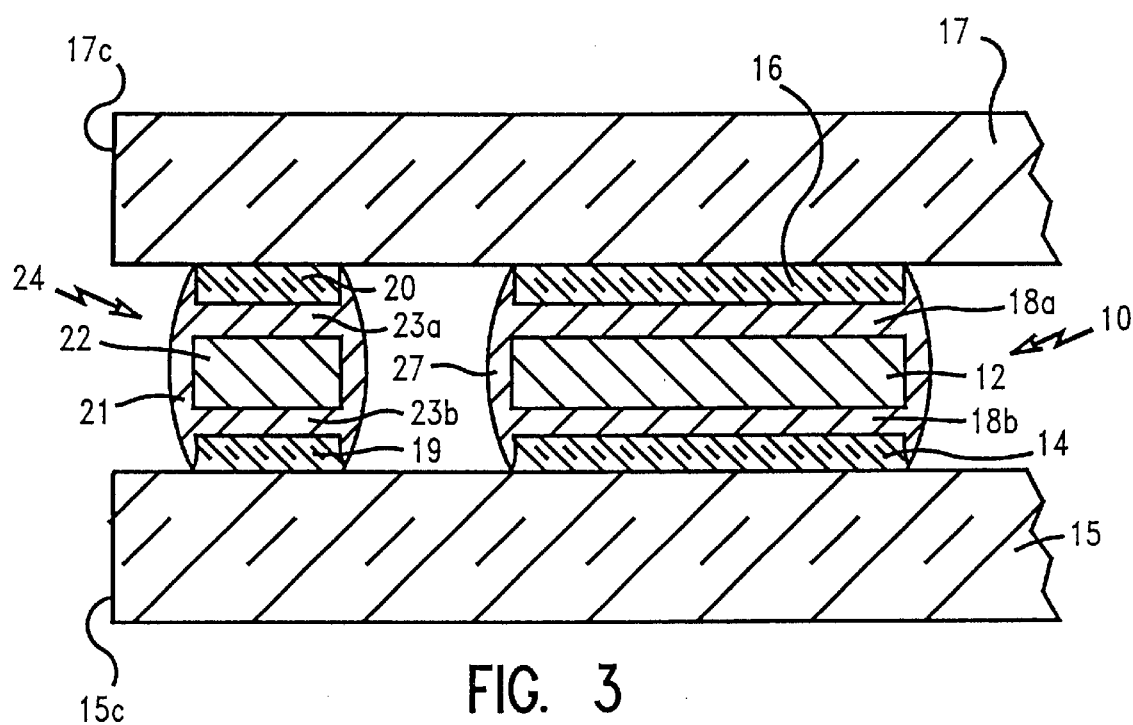
FIG. 3 shows a partial cross-sectional view of two multilayer ceramic substrates electrically and mechanically joined and hermetically sealed at the periphery of the substrates using the solder preform of the invention.

Referring now to FIG. 3, an assembly similar to that shown in FIG. 2C is shown except that the assembly is now hermetically sealed at the peripheries 15c and 17c of the substrates 15 and 17, respectively. Thus, reflowed solder preforms would be formed on substrate 15 as shown in FIG. 2B on the metallization pad 14 and on the seal band 19. The solder preform formed on metallization pad 14 after reflow, will comprise solder 27 having an intermediate core 12 with solder layers 18a and 18b being between the intermediate core 12 and the respective metallization pads 14 and 16. Sealing of the connected substrates 15 and 17 is provided by a reflowed seal band comprising solder 21 and an intermediate core material 22. A thin layer of solder shown as 23a and 23b is shown connecting the seal bands 19 and 20. The seal band preform is similar to that as shown in FIG. 1 and would comprise an upper layer of solder and a lower layer of solder (shown after reflow as 21) separated by an intermediate core 22. Typically, the seal band solder preform 24 is a continuous planar formed material which extends continuously around the periphery of substrates 15 and 17 at the respective edges 15c and 17c.

Figure 4:
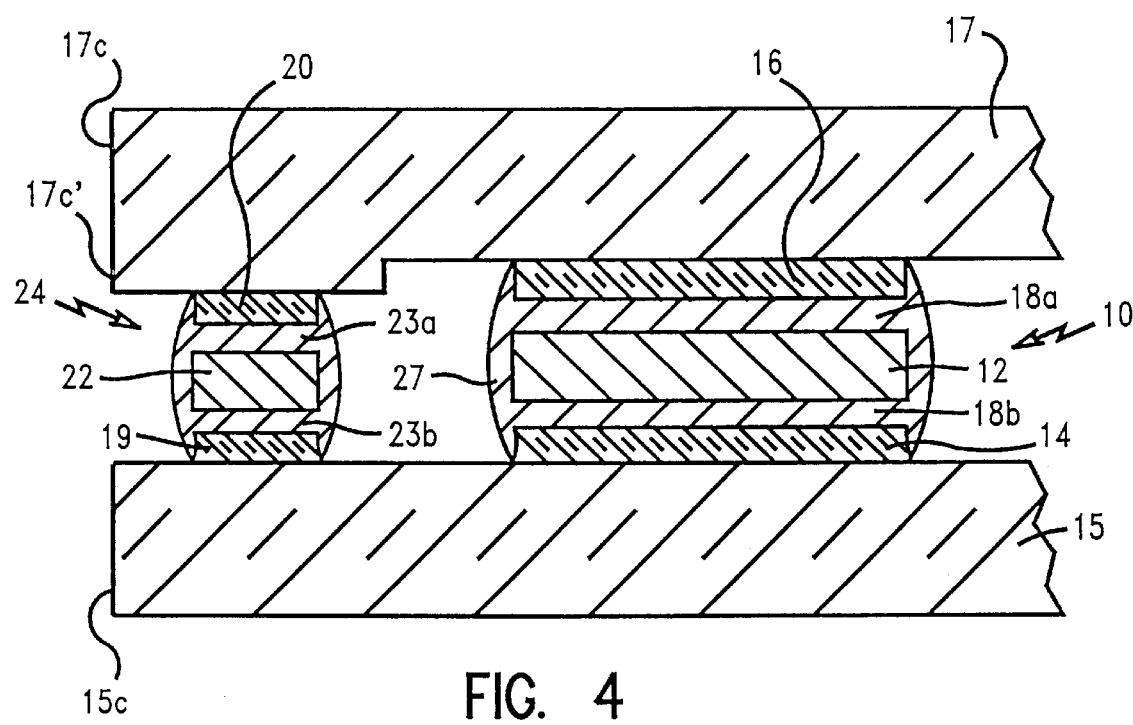
FIG. 4 similarly to FIG. 3 shows two multilayer ceramic substrates in cross-section being electrically and mechanically joined and hermetically sealed at the periphery of the multilayer ceramic substrates, the upper multilayer ceramic substrate having a downwardly extending edge.

FIG. 4 is similar to FIG. 3 except that substrate 17 has a downwardly extending edge 17c' which forms a narrow peripheral recess between substrates 15 and 17 than the recess where the metallization pads 14 and 16 are located. In this situation, the seal band solder preform used to form a hermetic seal between peripheral parts 19 and 20 will be of a thickness less than the thickness of the solder preform used to form the joints between the metallization pads 14 and 16.

Figure 5A:
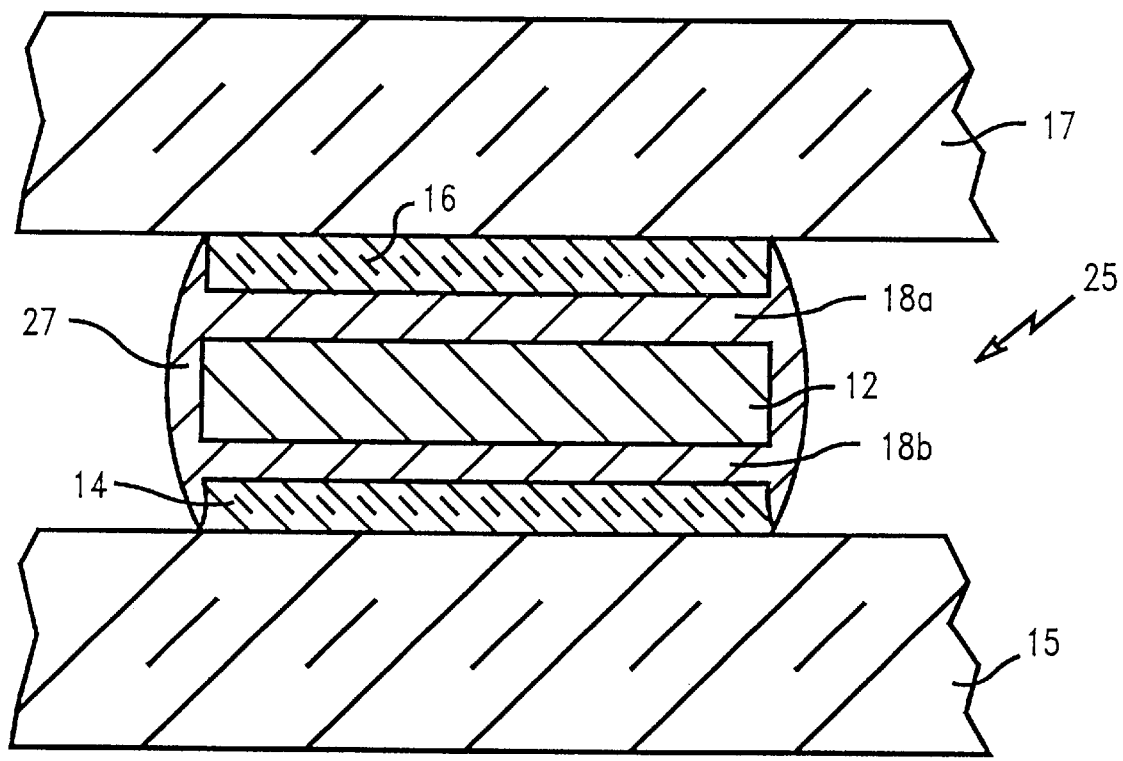
FIGS. 5A and 5B show a partial cross-sectional view of two multilayer ceramic substrates electrically and mechanically joined using the solder preform connector of the invention as shown in cross-section FIG. 5B.
Figure 5B:
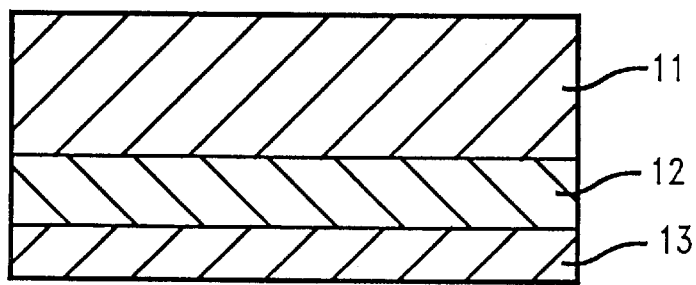

Referring now to FIGS. 5A and 5B, the use of a solder preform 25 having a thicker upper solder layer 11 is shown. Thus, solder preform 25 as shown in FIG. 5B has a thicker upper layer 11 and a thinner lower solder layer 13 separated by an intermediate core layer 12. When the solder preform 25 is used to form an interconnection between a multilayer ceramic substrate 15 and multilayer ceramic substrate 17 it can be seen as shown in FIG. 5A that the solder 27 has a solder layer 18a resulting from the reflow operation which is thicker between metallization pad 16 and intermediate core 12 than between metallization pad 14 and core 12 as shown by 18b. This type interconnection may be desirable for certain applications and can be used particularly to hermetically seal substrates where the Z-axis height needs to be adjusted depending on the interconnection height between the pads of the respective substrates.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An electronic assembly made using the following method:
   providing a plurality of solder preforms, the solder preforms comprising:
   a first lower layer of solder;
   a second intermediate layer of a material having an initial shape and which does not melt at the temperatures used to form the joint between the two electronic components; and
   a third upper layer of solder;
   positioning the first lower layer surface of each of the solder preforms on corresponding bonding pads of a first electronic component substrate and heating the substrate to melt the solder bonding the first lower layer surface of each of the solder preforms to the corresponding substrate pads, the third upper layer solder surface of the preform melting but still maintaining a third upper layer of solder on the preforms after heating;
   positioning a second electronic component proximate the first electronic component so that the third upper layer of the solder preforms on the first electronic component are adjacent to corresponding bonding pads on the second electronic component;
   heating the components to reflow the solder to bond the third upper layer of the solder preforms on the first electronic component to the corresponding pads on the second electronic component and forming the electronic assembly wherein the second intermediate layer maintains its initial shape.

2. The electronic assembly of claim 1 wherein the second intermediate layer is copper or a higher melting point solder than the solder of the first and third layers.

3. The electronic assembly of claim 1 wherein the thickness of the first layer and third layer are each about 25 to 150 micrometers.

4. The electronic assembly of claim 3 wherein the thickness of the second intermediate layer is about 50 to 500 micrometers.

5. The electronic assembly of claim 1 wherein the first and third solder layers have different thicknesses.

6. The electronic assembly of claim 1 wherein the solder used in the first layer and the third layer encapsulates the second intermediate layer after the first and second electronic components are bonded forming the electronic assembly.

7. A hermetically sealed electronic assembly made using the following method:
   providing a plurality of solder preforms and peripheral solder preforms, the solder preforms and peripheral solder preforms comprising:
   a first layer of solder;
   a second intermediate layer of a material having an initial shape and which does not melt at the temperatures used to form the joints between the two electronic components; and
   a third upper layer of solder;
   positioning the first layer surface of the solder preforms on bonding pads of a first electronic component substrate and the first layer surface of the peripheral solder preforms on peripheral bonding pads positioned around the periphery of the first electronic component substrate;
   heating the substrate to melt the solder bonding the first layer surface of the solder preforms to the bonding pads on the substrate and the first layer surface of the peripheral solder preforms around the periphery of the substrate to the peripheral bonding pads, the third upper layer solder surface of the solder preforms and peripheral solder preforms melting and still maintaining the third upper layer of solder on the solder preforms and peripheral solder preforms after heating;
   positioning a second electronic component proximate the first electronic component so that the third upper layer of the solder preforms on the first electronic component are adjacent to corresponding bonding pads on the second electronic component and the third upper layer of the peripheral solder preforms are adjacent to corresponding peripheral bonding pads on the second electronic component;

heating the component to reflow the solder to bond the third upper layer of the solder preforms on the first electronic component to the corresponding pads on the second electronic component and to bond the peripheral bonding pads of the second component to the third upper layer of the peripheral solder preforms bonded to the first component substrate and simultaneously forming the electronic assembly and hermetically sealing the electronic assembly wherein the second intermediate layer maintains its initial shape.

8. The electronic assembly of claim 7 wherein the second intermediate layer is copper or a higher melting point solder than the solder of the first and third layer.

9. The electronic assembly of claim 7 wherein the thickness of the first layer and third layer are each about 25 to 150 micrometers.

10. The electronic assembly of claim 9 wherein the thickness of the second intermediate layer is about 50 to 500 micrometers.

11. The electronic assembly of claim 7 wherein the first and third solder layers have different thicknesses.

12. The electronic assembly of claim 7 wherein the solder preform and peripheral solder preform have the same height.

13. The electronic assembly of claim 7 wherein the solder preform and peripheral solder preform have different heights.

14. The hermetically sealed electronic assembly of claim 7 wherein the solder of the first layer and the third layer encapsulates the second intermediate layer after the first and second electronic components are bonded forming the electronic assembly.

* * * * *